United States Patent
Suzuki et al.

(10) Patent No.: US 6,821,131 B2
(45) Date of Patent: Nov. 23, 2004

(54) IC SOCKET FOR A FINE PITCH IC PACKAGE

(75) Inventors: Katsumi Suzuki, Tokyo (JP); Takahiro Ishibashi, Tokyo (JP); Yuji Nakamura, Tokyo (JP); Shuuji Kunioka, Yokohama (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/692,750

(22) Filed: Oct. 27, 2003

(65) Prior Publication Data

US 2004/0137767 A1 Jul. 15, 2004

(30) Foreign Application Priority Data

Oct. 28, 2002 (JP) ........................................ 2002-313023

(51) Int. Cl.[7] .............................................. H01R 12/00
(52) U.S. Cl. .......................................... 439/73; 439/700
(58) Field of Search .............................. 439/68, 69, 70, 439/71, 73, 330, 331, 219, 700, 482, 824

(56) References Cited

U.S. PATENT DOCUMENTS

| | | | |
|---|---|---|---|
| 4,029,375 A | | 6/1977 | Gabrielian |
| 4,050,762 A | * | 9/1977 | Hines et al. ................. 439/824 |
| 4,082,399 A | | 4/1978 | Barkhuff |
| 4,508,405 A | | 4/1985 | Damon et al. |
| 4,560,926 A | * | 12/1985 | Cornu et al. ................. 324/761 |
| 4,686,465 A | * | 8/1987 | Kruger ........................ 324/754 |
| 4,838,801 A | * | 6/1989 | Bertoglio et al. ............. 439/83 |
| 4,889,496 A | | 12/1989 | Neidich |
| 5,214,374 A | * | 5/1993 | St. Onge ..................... 324/754 |
| 5,215,472 A | * | 6/1993 | DelPrete et al. .............. 439/71 |
| 5,227,718 A | * | 7/1993 | Stowers et al. ............. 324/761 |

(List continued on next page.)

FOREIGN PATENT DOCUMENTS

| | | |
|---|---|---|
| JP | 8-213088 | 8/1996 |
| JP | 10-214649 | 8/1998 |
| JP | 2000-292437 | 10/2000 |
| JP | 2000-329790 | 11/2000 |
| JP | 2001-093634 | 4/2001 |
| JP | 2001-208793 | 8/2001 |
| JP | 2002-139513 | 5/2002 |
| JP | 2002-311083 | 10/2002 |

OTHER PUBLICATIONS

"Socketpin, Specifications", pp. 1–2 (http://www.nhkspg.co.jp/mc/spec/scp.html) an excerpt from Home Page of NHK Spring Co., Ltd., Apr. 2002 (p. 1), May 10, 2002 (p. 2).

"Thinprobe, Specifications", pp. 1–2 (http://nhkspg.co.jp/mc/spec/thp.html) an excerpt from Home Page of NHK Spring Co., Ltd., Mar. 2001 (p. 1), Dec. 1999 (p.2).

*Primary Examiner*—Ross Gushi
(74) *Attorney, Agent, or Firm*—Finnegan, Henderson, Farabow, Garrett & Dunner, LLP

(57) ABSTRACT

An IC socket for the fine pitch IC package includes a socket body having an opening for guiding the IC package, an insulation base having a plurality of through-holes corresponding to the external terminals of the IC package, the contact pins placed in the through-holes, and a cover member for applying a predetermined pressure to bring the external terminals of the IC package and the contact pins into contact with one another. Each of the contact pins is formed with a first plunger including a terminal portion to be in contact with the external terminal of the IC package, a wider portion whose width is larger than the width of the terminal portion and the shaft whose width is equal to or smaller than the terminal portion, the coil spring, and the second plunger having a U-shape section, to be connected with the contact terminal of external circuit.

10 Claims, 18 Drawing Sheets

U.S. PATENT DOCUMENTS

| | | | |
|---|---|---|---|
| 5,414,369 A | | 5/1995 | Kazama |
| 5,420,519 A | * | 5/1995 | Stowers et al. .............. 324/754 |
| 5,570,033 A | * | 10/1996 | Staab .......................... 324/761 |
| 5,641,315 A | * | 6/1997 | Swart et al. ................. 439/824 |
| 5,727,954 A | | 3/1998 | Kato et al. |
| 5,731,710 A | * | 3/1998 | Mizuno et al. ............. 324/761 |
| 5,744,977 A | * | 4/1998 | Cuautla ....................... 324/761 |
| 5,955,888 A | * | 9/1999 | Frederickson et al. ...... 324/761 |
| 6,036,503 A | * | 3/2000 | Tsuchida ..................... 439/70 |
| 6,159,056 A | * | 12/2000 | Boyle ......................... 439/700 |
| 6,190,181 B1 | * | 2/2001 | Affolter et al. ............... 439/70 |
| 6,213,787 B1 | * | 4/2001 | Murphy ....................... 439/71 |
| 6,220,870 B1 | * | 4/2001 | Barabi et al. ................. 439/71 |
| 6,265,886 B1 | * | 7/2001 | Hamren ...................... 324/755 |
| 6,267,603 B1 | * | 7/2001 | Yamamoto et al. ........... 439/70 |
| 6,297,654 B1 | * | 10/2001 | Barabi ......................... 324/755 |
| 6,390,826 B1 | * | 5/2002 | Affolter et al. ............... 439/70 |
| 6,398,592 B1 | * | 6/2002 | Mori et al. .................. 439/700 |
| 6,439,897 B1 | * | 8/2002 | Ikeya .......................... 439/73 |
| 6,447,343 B1 | * | 9/2002 | Zhang et al. ................ 439/700 |
| 6,471,524 B1 | * | 10/2002 | Nakano et al. ................ 439/70 |
| 6,503,089 B2 | * | 1/2003 | Saijo et al. .................... 439/70 |
| 6,506,082 B1 | * | 1/2003 | Meek et al. ................. 439/700 |
| 6,554,654 B1 | * | 4/2003 | Stoddard et al. ............ 439/700 |
| 6,655,983 B1 | * | 12/2003 | Ishikawa et al. ............. 439/482 |
| 6,663,439 B2 | * | 12/2003 | Henry et al. ................ 439/700 |
| 6,685,492 B2 | * | 2/2004 | Winter et al. ................ 439/219 |
| 6,743,043 B2 | * | 6/2004 | Yamada ...................... 439/482 |

\* cited by examiner

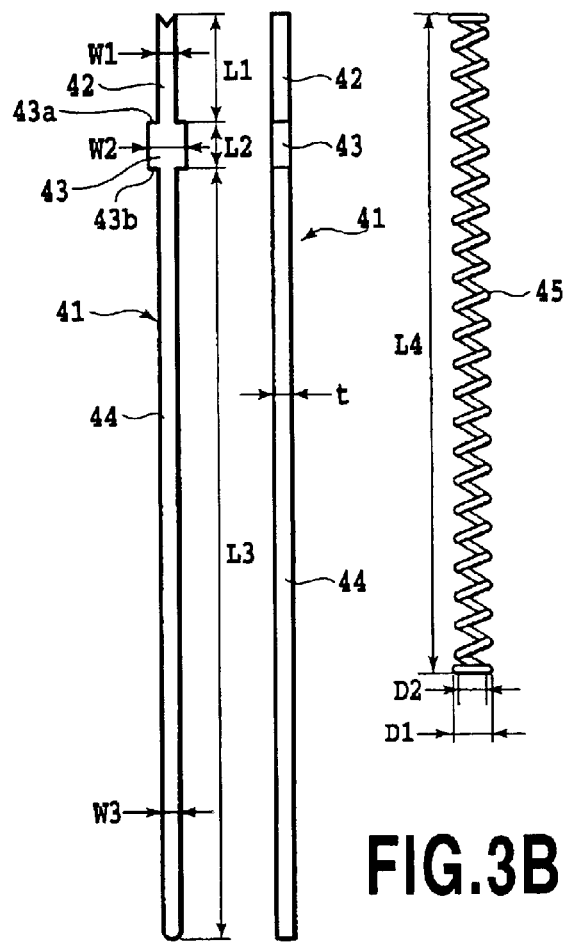
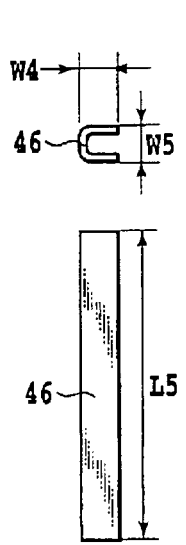
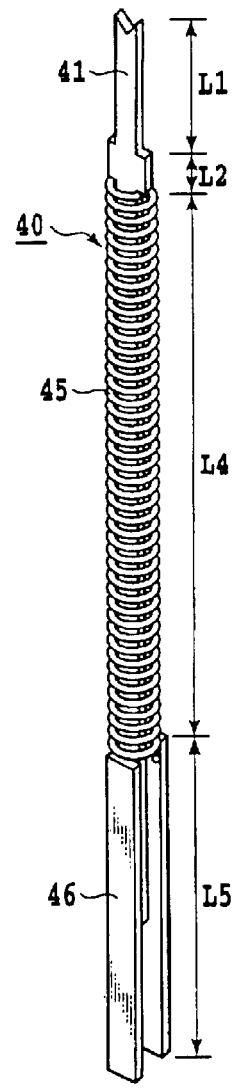
FIG.3A
FIG.3B
FIG.3C
FIG.3D

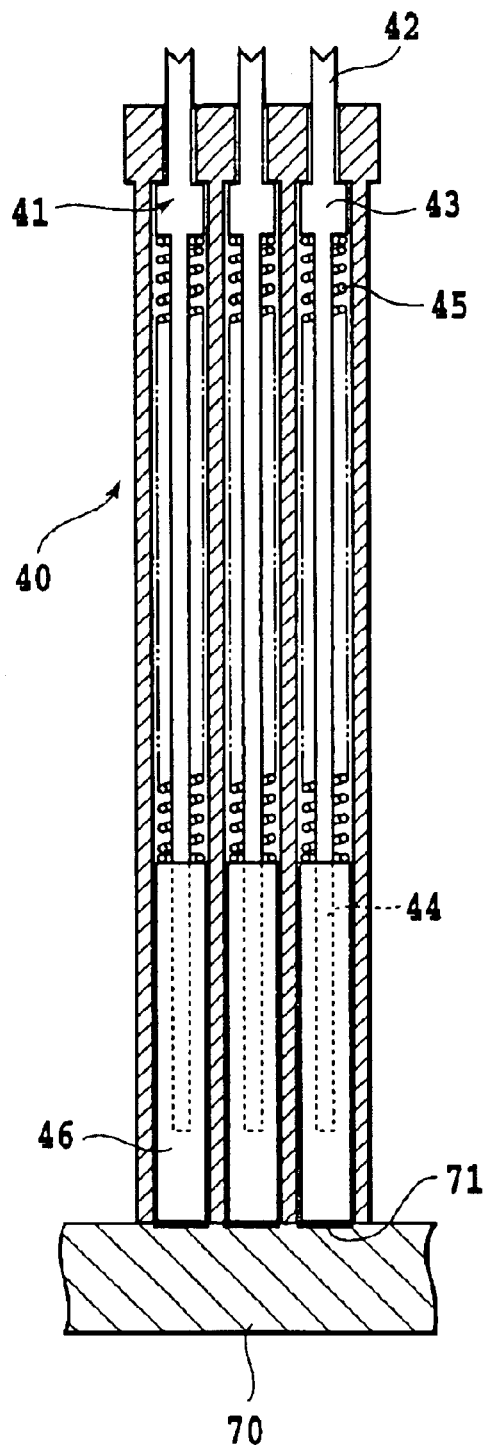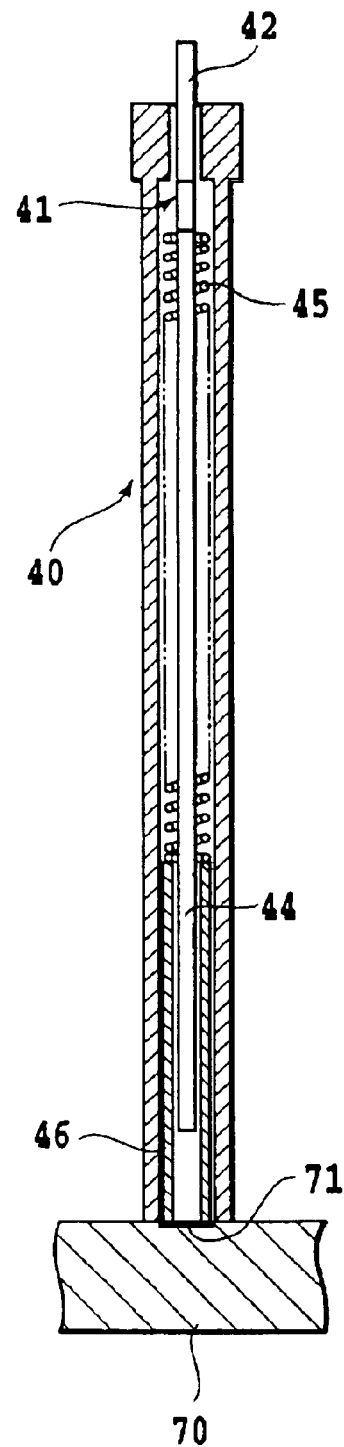
FIG.5A　　　　FIG.5B

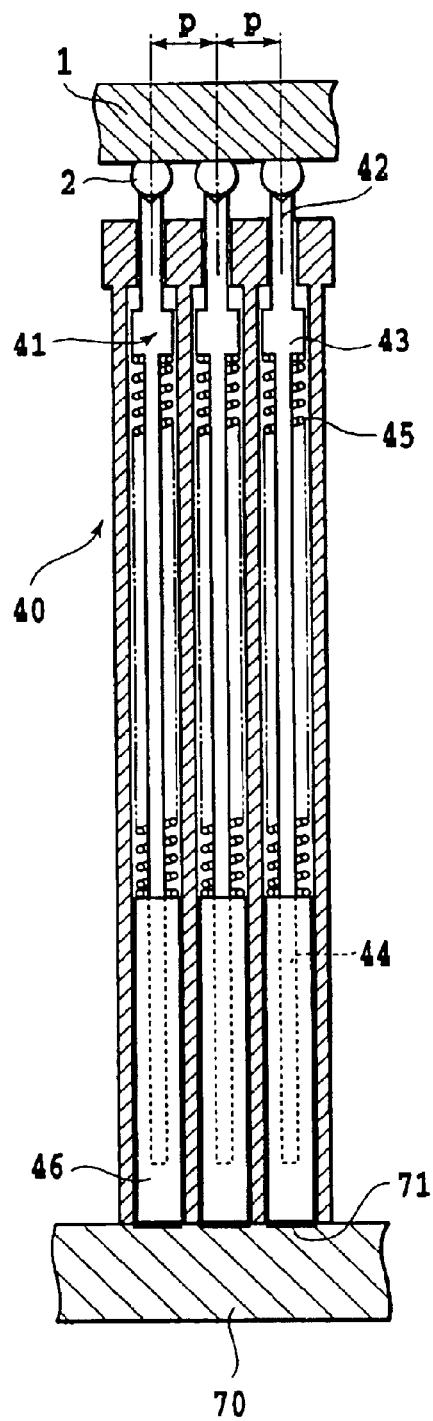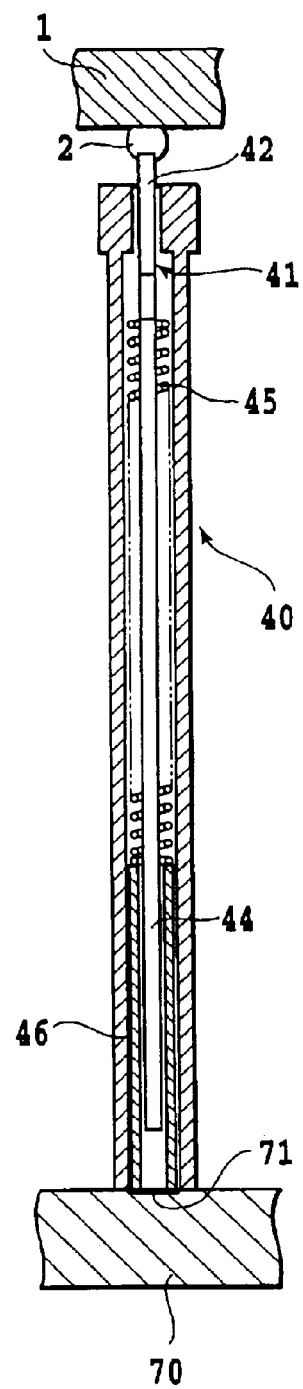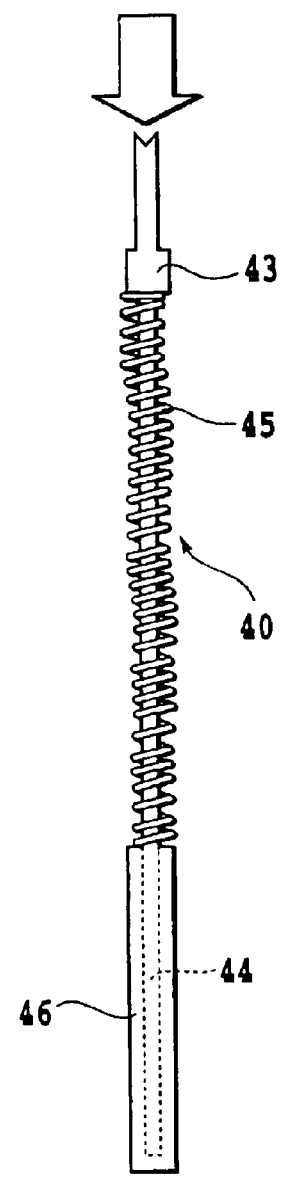
FIG.6A  FIG.6B  FIG.6C

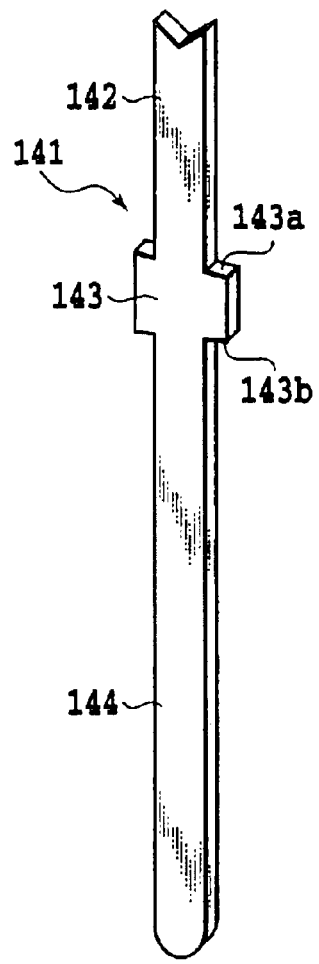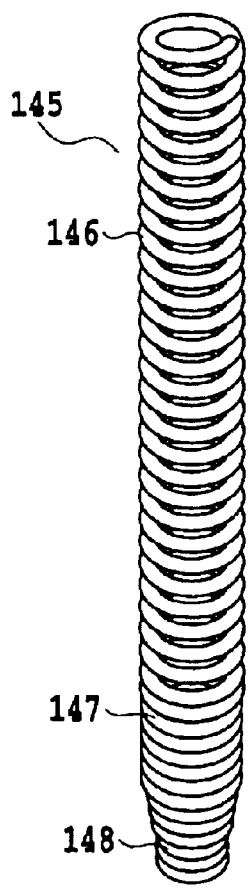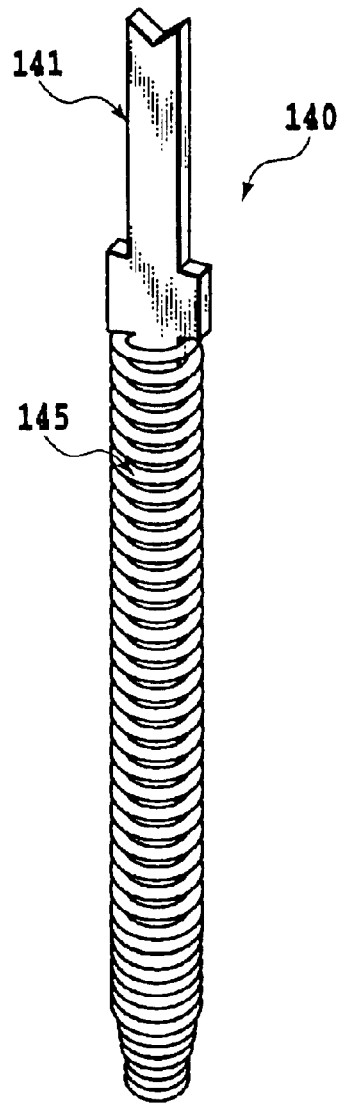
FIG.7A     FIG.7B     FIG.7C

IC SOCKET FOR A FINE PITCH IC PACKAGE

This application claims priority from Japanese Patent Application No. 2002-313023 filed Oct. 28, 2002, which is incorporated hereinto by reference.

BACKGROUND OF THE INVENTION

1. Field of the Invention

The present invention relates to an IC socket for the fine pitch IC package such as the CSP (Chip Size Package), more particularly to an IC socket for the fine pitch IC package such as one obtained by improving the contact structure of the IC socket for the fine pitch IC package.

2. Description of the Related Art

In the conventional IC sockets for the fine pitch IC packages such as the CPS or the like, the cylindrical contact pins elastically deformable in vertical direction have been used as contacts for electrically connecting the IC package with a test board (Refer to U.S. Pat. No. 5,727,95, Japanese Patent Application Laid-open No. 10-214649(1998), Japanese Patent Application Laid-open No. 2001-208793, etc.).

For example, the contact pin disclosed in U.S. Pat. No. 5,727,954 will be described briefly referring to FIG. 17.

As shown in FIG. 17, contact pin 101 comprises an upper pin terminal 104, a lower pin terminal 105 and a coil spring 107. The upper pin terminal 104 comprises a smaller-diameter pin terminal 104a, to be in contact with the external terminal or solder ball 117 of the IC package 116, and a larger-diameter cylindrical sleeve 104b having a bottom and opening downward. The lower pin terminal 105 comprises the smaller-diameter portion 105a, to be in contact with the contact terminal or land 115 of the external circuit such as that of the testing board 114, and the larger-diameter columnar fitting member 105b fitted so as to be movable vertically within the cylindrical sleeve 104b. Further, the coil spring 107 is placed within the cylindrical sleeve 104b to force the upper pin terminal 104 upward and the lower pin terminal 105 downward respectively. Further, the numeral 102 denotes an insulation base made from an insulating material, and each of the contact pins 101 is placed within a corresponding through-hole 103 provided with the insulation base 102.

Such a telescopic construction of the contact pin 101 permits the upper pin terminal 104 and the lower pin terminal 105 to move telescopically or vertically to each other, and the force of the coil spring 107 enables the pin terminal 104a of the upper pin terminal 104 to contact with the external terminal 117 of the IC package 116, while the pin terminal 105a of the lower terminal 105 to contact the contact terminal 115 of the test board 114 respectively with a predetermined pressure.

In recent years, as the demand for the IC packages of higher performances increases, the external terminals of such IC package are required not only to be increased in number but also to be more fine pitch. As a result, the IC packages with the external terminals pitched less than 0.4 mm have come to be developed to meet the increasing demand. As the level of the fine pitch of the external contacts of the IC package rises, naturally it becomes necessary for the IC socket to have fine pitch contacts in order to electrically connect the external terminals of the IC package with the test board in an occasion such as the long-run reliability test or screening of the IC packages.

As discussed previously, the cylindrical contact pin used for the fine pitch contact pin in the conventional IC socket comprises a cylindrical sleeve designed for containing a columnar fitting shaft and a coil spring. As the pitch of the contacts becomes shorter, it naturally becomes necessary to set the outside diameter of the cylindrical sleeve to be less than the pitch. However, the manufacture of the cylindrical sleeve having such an extremely small outside diameter requires an exquisite manufacturing technique and a considerable length of time, which leads to the rise of the unit manufacturing cost of individual cylindrical sleeves and the rise of the manufacturing cost of IC socket itself, since the recent IC socket is required to be provided with a large number of fine pitch contacts.

For instance, a contact pin structure not using the costly cylindrical sleeves has been disclosed in Japanese Patent Application Laid-open No. 2001-93634 and U.S. Pat. No. 5,414,369. In the proposed cases, the current flows through the coil spring, thereby causing the path of the current to become longer than necessary and resulting electrically adverse effects such as the development of the magnetic field around the coil spring and the increase in the resistance to the flowing current resulting in generating the heat.

The object of the present invention is to provide an IC socket for the IC package featuring the ease of manufacturing, good electrical characteristics, the contact pins designed for being vertically displaceable and suiting the fine pitch arrangement, in consideration of the above-mentioned problems of the conventional IC sockets.

SUMMARY OF THE INVENTION

In order to attain the above-mentioned object of the present invention, the IC socket for the fine pitch IC package according to the present invention comprises a socket body having an opening for guiding the IC package to a predetermined position, an insulation base having a plurality of through-holes corresponding to the external terminals of the IC package, contact pins placed in the through-holes respectively, and a cover member for applying a predetermined pressure to bring the external terminals of the IC package and the contact pins into contact with one another, wherein each of the contact pins is formed with a first plunger, including a terminal portion to be in contact with the external terminal of the IC package, a wider portion whose width is larger than the width of the terminal portion and a shaft portion whose width is equal to or smaller than the width of the terminal portion, a coil spring permitting the shaft to be inserted therein, and a second plunger having an U-shape section, to be connected with the contact terminal of the external circuit.

Further, each of the contact pins may be formed with a plunger, including a terminal portion to be in contact with the external terminal of the IC package, a wider portion whose width is larger than the first terminal portion and a shaft whose width is equal to or smaller than the width of the first terminal portion, and a coil spring unit, including a coil spring permitting the shaft to be inserted therein, and a tight-winding coil portion following the coil spring.

Further, each of the contact pins may be formed with a first plunger, including a first terminal portion to be in contact with the external terminal of the IC package, a wider portion whose width is larger than the width of the first terminal portion and in which a fitting indent opening downward is disposed, and a second plunger, including a second terminal portion to be in contact with the contact terminal of the external circuit, and a pair of legs extending upward from the second terminal portion to fit in the fitting indent and having elastically deformable bent portions provided at the middle of the legs.

Furthermore, each of the contact pins may be formed with a first plunger, including a first terminal portion to be in contact with the external terminal of the IC package, a wider portion whose width is larger than the width of the first terminal portion and provided with a pair of legs extending downward from the two sides of the wider portion, a second plunger, including a second terminal portion to be connected with the contact terminal of the external circuit and an extended portion extending upward from the second terminal portion and slidably interposed between the pair of the legs of the wider portion and a coil spring interposed between the pair of the legs.

The above and other objects, effects, features and advantages of the present invention will become more apparent from the following description of embodiments thereof taken in conjunction with the accompanying drawings.

BRIEF DESCRIPTION OF THE DRAWINGS

FIGS. 1A and 1B show the IC sockets for the fine pitch IC package installed on a pitch conversion substrate, of which FIG. 1A is a plan view, while FIG. 1B is a side view;

FIGS. 3A, 3B, 3C and 3D are the exploded views and assembled view of the contact pin according to the first embodiment; FIG. 3A shows the front view and side view of the first plunger; FIG. 3B is the side view of the coil spring; FIG. 3C shows the top view and the front view of the second plunger; FIG. 3D is a perspective view of the contact pin according to the first embodiment formed by assembling the various elements shown in FIG. 3A through FIG. 3C;

FIGS. 5A and 5B show the partial sectional views of the contact pin according to the first embodiment incorporated into the insulation base, of which FIG. 5A is a front view, while FIG. 5B is a side view;

FIGS. 6A, 6B and 6C show the partial sectional views of the contact pin according to the first embodiment incorporated into the insulation base in a state wherein the IC package is mounted on the IC socket; FIG. 6A is a front view; FIG. 6B is a side view; and FIG. 6C shows a deformed state of the contact pin;

FIGS. 7A, 7B and 7C are the exploded views and assembled view of the contact pin according to the second embodiment, of which FIG. 7A shows the exploded view and the assembled view of the first plunger; FIG. 7B is a side view of the coil spring; FIG. 7C is a perspective view of the contact pin according to the second embodiment formed by assembling the various elements shown in FIGS. 7A and 7B;

FIGS. 8A and 8B are the partial sectional views of the contact pin according to the second embodiment incorporated into the insulation member, of which FIG. 8A shows the state in which the IC package is not mounted on the IC socket, while FIG. 8B shows the state in which the IC package is mounted on the IC socket;

DETAILED DESCRIPTION OF PREFERRED EMBODIMENTS

The First Embodiment

Figure 1A:
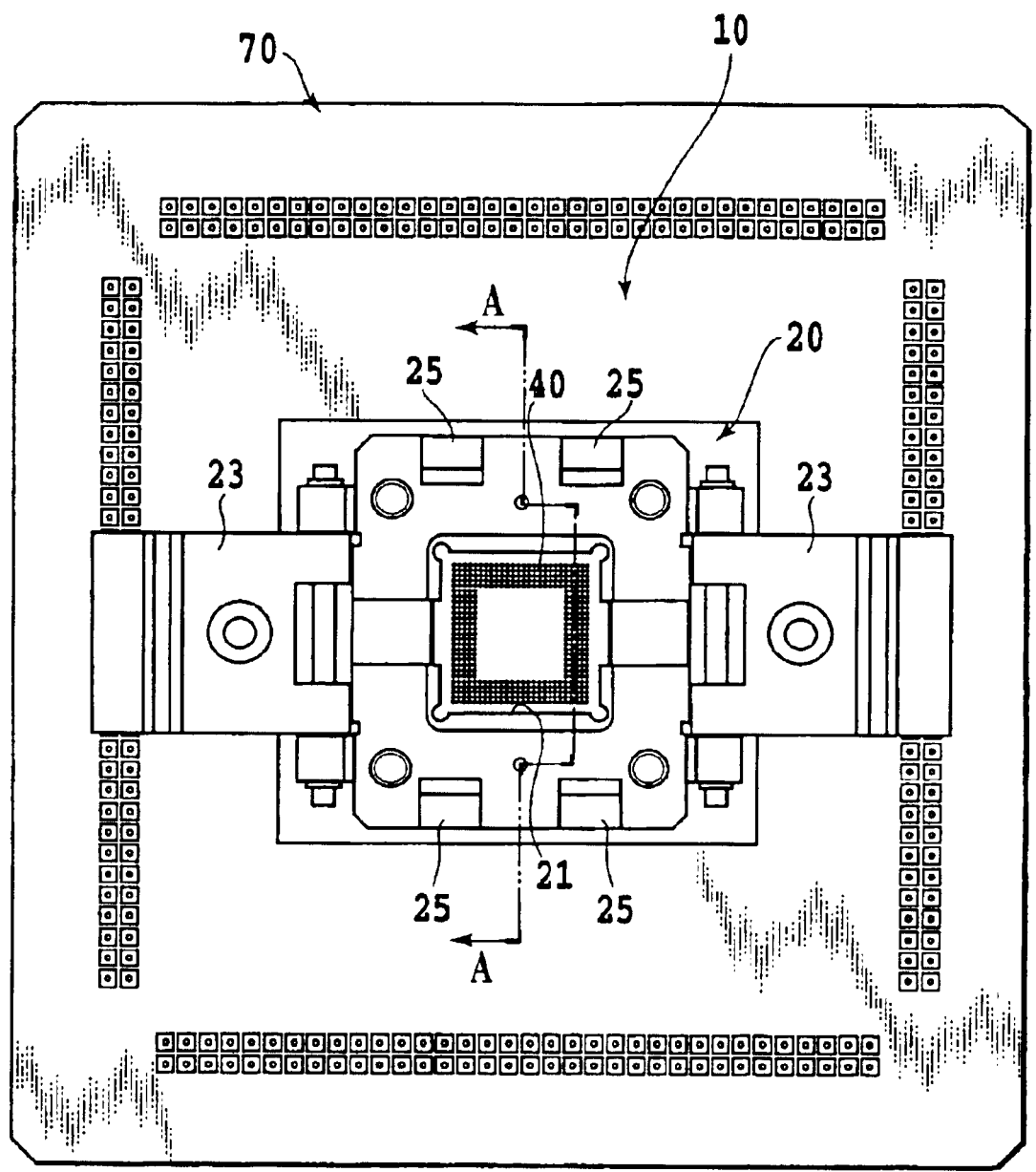
Figure 1B:
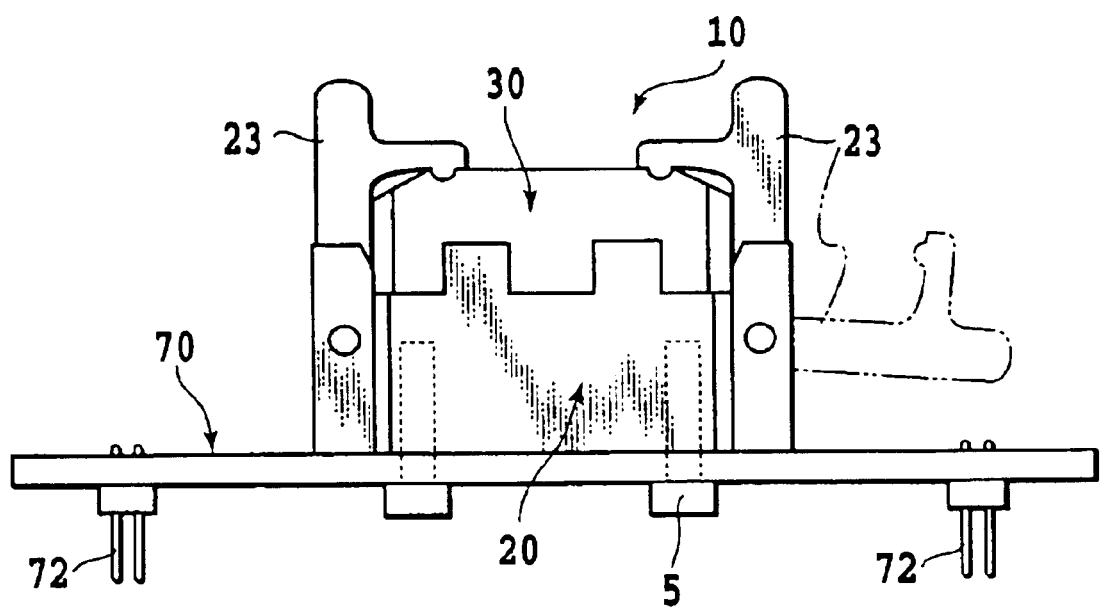
Figure 2:
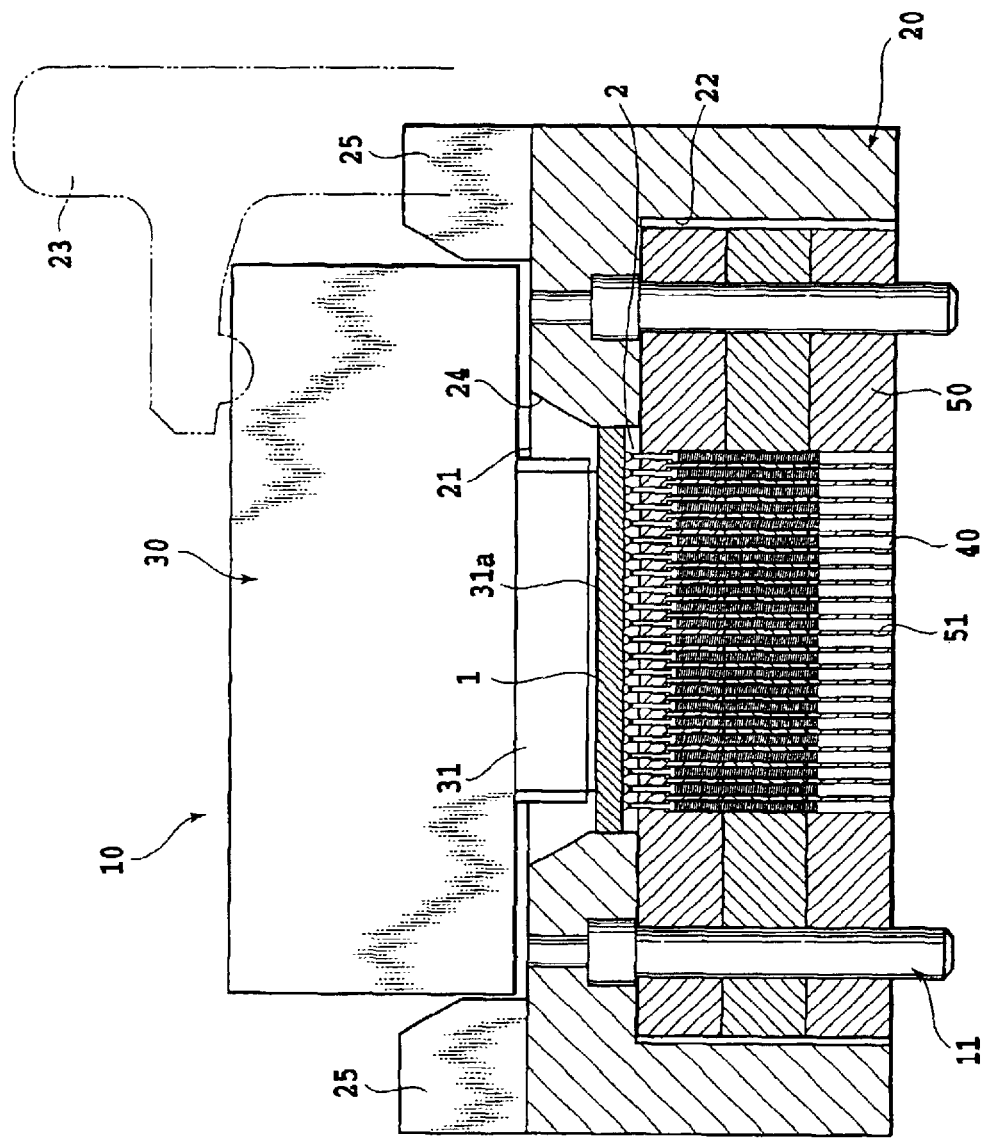
FIG. 2 is an enlarged schematic sectional view of the IC socket taken along A—A line in FIG. 1A.

First, the IC socket for the fine pitch IC package will be outlined referring to FIGS. 1A, 1B and 2. FIGS. 1A and 1B show an IC socket for the fine pitch IC package mounted on the pitch conversion substrate, wherein FIG. 1A is a plan view, while FIG. 1B is a side view. FIG. 2 is an enlarged schematic sectional view of the IC socket taken along A—A line in FIG. 1A.

The IC socket 10 for the fine pitch IC package according to the present invention generally comprises a socket body 20, a cover member 30, a plurality of contact pins 40 and an insulation base 50, and is mounted on a pitch conversion substrate 70, serving as an external printed circuit board, through a plurality of setscrews 5 provided on the socket body 20.

As seen from FIGS. 1A and 1B, the socket body 20 has a substantially rectangular parallelepiped form. The socket body 20 is provided with a rectangular opening 21 which is located at the center of the surface thereof and designed for positioning the IC package, and an indented space 22 communicating with the opening 21, having an sectional area larger than the sectional area of the opening 21 and opening towards the bottom of the socket body 20. Further, retaining members 23 and 23 to serve as a pair is pivotably formed on the opposing sidewalls of the socket body 20 respectively so as to fix the cover member 30 to the socket body 20 by engaging with the cover member 30.

Guiding walls 24, each comprising an inclined wall portion and a vertical wall portion, are provided inside the opening 21 so that the IC package 1 to be mounted from above can be positioned on contact pins 40. Further, the socket body 20 forming the bottom of the indented space 22 has a plurality of positioning pin 11 (4 positioning pins in the present embodiment) fixed at predetermined positions (at four corners of the indented space 22). Further, reference numeral 25 represents the guides for guiding a cover member 30 provided at predetermined places on the peripheral area of the surface opening 21 of the socket body 20.

The cover member 30 is provided with a pushing member 31 projecting from the bottom of the cover member 30. As shown in FIG. 2, when the cover member 30 is made to cover the surface of the IC socket 10, that is, when the bottom of the cover member 30 comes into contact with the surface the socket body 20 of the IC socket 10, the pushing member 31 comes to be set within the opening 21 formed in the socket body 20. When the IC package 1 is within the opening 21, that is, when IC package 1 is mounted on the contact pins 40, the pushing surface 31a of the pushing member 31 comes into contact with the back of the IC package 1 to force IC package 1 downward to a predetermined extent. As a result, the solder ball 2 of the IC package 1 and the contact pins 40 are brought into contact with one another with a predetermined pressure.

The top of the cover member 30 engages with a pair of retaining members 23, 23, which are formed so as to be pivotable on the socket body 20. While the cover member 30 engages with the pair of retaining members, 23, 23, the pushing member 31 keeps the IC package 1 in contact the contact pins 40 with a predetermined pressure.

Further, said cover member 30 is independent from the socket body 20, but the cover member 30 may be pivotablly mounted on the sidewall of the socket body 20.

As described later, in each of the contact pins 40, a first plunger 41, as being a first terminal to electrically contact with the external terminal or solder ball 2 of the IC package 1, is designed to be movable in vertical direction and also placed in a through-hole 51 formed in the insulation base 50. Then, a number of contact pins 40, equal or more in number with external terminals 2 of the IC package 1 to be mounted, are arranged corresponding to the matrix arrangement pattern of the external terminals 2.

A number of through-holes 51, provided in the insulation base 50, contain the contact pins 40 therein so as to be in contact with the corresponding external terminals 2. Further, the insulation base 50 is fixed within the indented space 22 of the socket body 20 by means of the setscrew 5 provided with the socket body 20. The insulation base 50 is, as shown in FIG. 1A, fixed in the indented space 22 so as to enable the tip of the first plunger 41 of the contact pin 40 to be in the opening 21 of the socket body 20.

The IC socket 10 is installed on the pitch conversion substrate 70 through the setscrew 5 so that a second plunger 46, as being the second terminal of the contact pin 40, is permitted to elastically contact the land 71 of the printed circuit pattern formed as an external circuit on the pitch conversion substrate 70. The pitch conversion substrate 70 is also electrically connected with a test board or the like through a pitch conversion connector 72.

The procedure for installing the IC package 1 on the IC socket 10, designed as described above, will be described briefly in the following.

With the cover member 30 of the IC socket 10 removed, the IC package 1 is installed on the contact pins 40, lying below the opening 21, through the opening 21 from above of the IC socket 10. In this case, the IC package 1 is guided by the guiding walls 24 of the opening 21 to be positioned so that the solder balls to serve as the external terminals of the IC package 1 come onto the corresponding contact pins 40.

Then, when the cover member 30 is placed to cover the top of the socket body 20, the pushing member 31 is inserted into the opening 21. By so doing, the pushing face 31a of the cover member 30 comes to contact the back of the IC package 1 to thereby push the IC package 1 downward to a predetermined extent. On the underside of the IC package 1 there are provided a plurality of solder balls to come into contact with the first plungers 41 of the corresponding contact pins 40. Since the first plunger 41 is movable vertically, the IC package 1, when moved downward to a predetermined extent, is subjected to the reaction force of the contact pin 40, whereby each solder ball 2 of the IC package 1 and each first plunger 41 of each contact pin 40 are made to come into contact with each other with a predetermined pressure, and, in consequence, the solder ball and the first plunger 41 are surely made to come into electrical contact with each other.

Subsequently, a pair of retaining members 23, 23, is made to pivot to engage with the top of the cover member 30 to thereby complete the installation of the IC package 1. Further, to uninstall the IC package from the IC socket, the procedure for installation should be reversed.

What has been discussed to this point is concerned with the total structure of the IC socket according to the present invention; from this point on, however, the contact pin 40, characterizing the present invention, will be discussed in detail. Further, in the following description, unless otherwise specified, the IC socket means one for installing the IC package whose solder balls to serve as the external terminals are pitched to 0.4 mm.

Figure 4:
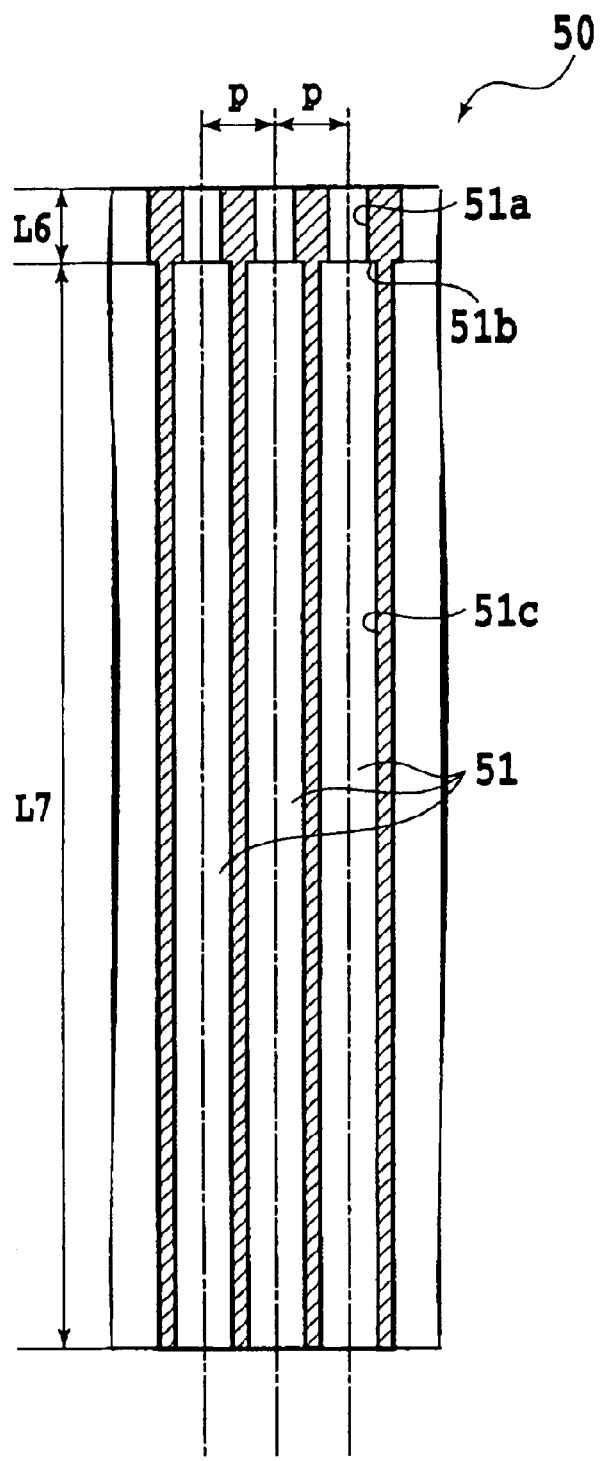
FIG. 4 is a partial enlarged view of the insulation base incorporating the contact pins.

FIGS. 3A through 6C show a contact pin as the first embodiment of the present invention. FIGS. 3A–3D show both the exploded view and the assembled view of a contact pin, wherein FIG. 3A shows a front view and a side view of the first plunger; FIG. 3B a side view of a coil spring; FIG. 3C a top view and a front view of the second plunger; FIG. 3D a perspective view of a contact pin to be formed by assembling the various elements shown in FIGS. 3A through 3C. FIG. 4 is a partial enlarged view of the insulation substrate into which the contact pins are incorporated. FIGS. 5A and 5B are partial sectional views of the contact pin incorporated into the insulation member, showing the state in which the IC package is not installed; FIG. 5A is a front view; FIG. 5B is a side view. FIGS. 6A–6C are partial sectional views of a contact pin incorporated into the insulation member, showing the state in which the IC package is installed on the IC socket, wherein FIG. 6A is a front view; FIG. 6B a side view; FIG. 6C the deformed state of the contact pin.

The contact pin 40 comprises a first plunger 41, a coil spring 45 and a second plunger 46 as are shown in FIGS. 3A, 3B and 3C respectively.

The first plunger 41 is designed to function as a first terminal to contact electrically with the solder ball 2 of the IC package 1, and comprises, as shown in FIG. 3A, a terminal portion 42 for making the electrical contact with the solder ball 2 of the IC package 1, a wider portion 43, including an upper step 43a for preventing the first plunger 41 from jumping out of the through-hole 51 of the insulation base 50 and a lower step 43b for stopping a coil spring 45, and a shaft 44 designed for moving vertically inside the coil spring 45 and the second plunger 46. Further, in FIG. 3A, L1, L2 and L3 represent the lengths of the terminal portion 42, the wider portion 43 and shaft 44 of the first plunger 41, while W1, W2 and W3 represent the widths of the terminal portion 42, the wider portion 43 and the shaft 44 of the first plunger 41 respectively.

Figure 9:
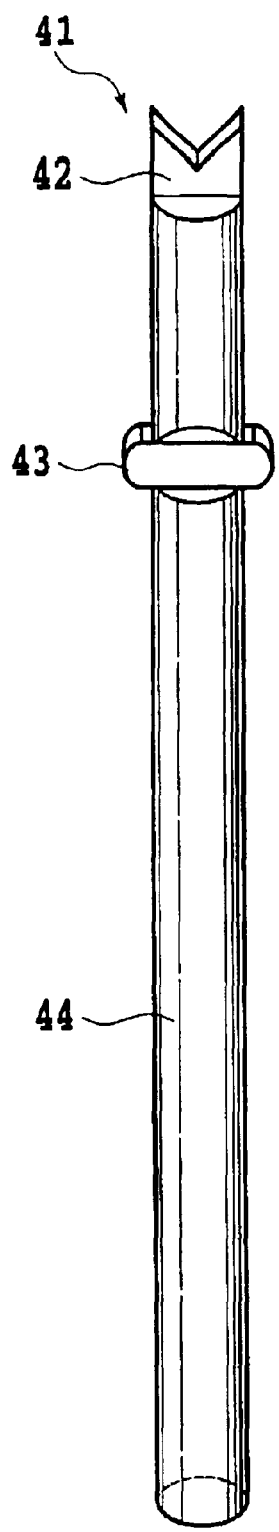
FIG. 9 shows a variation of the plunger to be in contact with the IC package.

The first plunger is cut to a predetermined form from a thin metal sheet of about 0.1 mm thick by a press work, and the surface thereof is plated with the Ni—Au. The formed first plunger 41 comprises the terminal portion 42 of about 0.15 mm wide (W1), the wider portion 43 of about 0.25 mm wide (W2) and the shaft 44 of about 0.12 mm wide (W3). Further, the tip of the terminal portion 42 is formed into a triangular indent having an angle of about 90° so that a good contact with the solder ball 2 of the IC package 1 can be maintained. Further, as described above, in the case of the present embodiment, the first plunger 41 is formed by cutting the thin metal sheet by the press work; however, as shown in FIG. 9, a columnar bar having the diameter of about 0.1 mm, whose portions corresponding to the tip of the terminal portion 42 and the wider portion 43 are flattened by the press work, may be substituted.

The coil spring 45 is made to have the outside diameter (D1) that is substantially equal to the width (W2) of the wider portion 43 of the first plunger 41 so that the shaft 44 of the first plunger 41 is permitted to move up and down within the spring 45. More specifically, the coil spring 45 has the inside diameter that is a little smaller than the width (W3) of the shaft 44. Further, the length L4 of the coil spring 45, in the state of being free of the load, is desired to be a little shorter than the length L3 of the shaft 44 of the first plunger 41.

The second plunger 46 functions as a second terminal for making an electrical contact with the land 71 of the printed circuit pattern formed on the pitch conversion substrate 70. In the case of the present embodiment, as shown in FIG. 3C, the second plunger 46 first is cut from a thin metal sheet (about 0.05 mm thick) by the press work to make into a predetermined form (a rectangular form in the case of the present embodiment) and then is folded to a form having a substantially U-shape section also by the press work. More specifically, as shown in FIG. 3C, the second plunger 46 has no wall on the right-hand side thereof to be kept open. The width (W4) and the depth (W5) of the second plunger 46 are desired to be substantially equal to the width (W3) of the wider portion 43 of the first plunger 41. Further, the second plunger 46 is also has its surface plated with the Ni—Au similarly to the first plunger 41. For reference, L5 represents the length of the second plunger 46.

As illustrated in FIG. 3D, the contact pin 40 is formed by assembling the first plunger 41, the coil spring 45 and the second plunger 46 so that the upper end of the coil spring 45 engages with a lower stepped portion 43b of the wider portion 43 of the first plunger 41, while the lower end of the coil spring 45 engages with the upper end of the second plunger 46. When assembled, the coil spring 45 is free of load, and thus the length of the contact pin is equivalent to L1+L2+L4+L5.

FIG. 4 shows the insulation base 50 wherein the through-hole 51 for containing the contact pin 40 is provided. The through-hole 51 comprises a smaller-diameter portion 51a, for permitting the vertical motion of the terminal portion 42 of the first plunger 41 therein, a larger-diameter portion 51c, for containing the first plunger 41 other than the terminal portion 42, the coil spring 45 and the second plunger 46, and a step 51b, provided between the smaller-diameter portion 51a and the larger-diameter portion 51c. The step 51b engages with the upper step 43a of the wider portion 43 of the first plunger 41 to thereby prevent the first plunger 41 from coming out of the through-hole 51 to move upward. Further, the horizontal section of the through-hole 51 may be either circular or rectangular. When the horizontal section of the through-hole 51 is rectangular, the direction of the first plunger 41 (or the contact pin 40) can be kept constant. Further, the insulation base 50 may be composed of a plurality of layers (3 layers in the case of the present embodiment). By so doing, the through-hole 51 may be formed more easily.

The length L6 of the smaller-diameter portion 51a of the through-hole 51 is made shorter than the length L1 of the terminal portion 42 of the first plunger 41, while the length L7 of the larger-diameter portion 51c is made shorter than the length (L2+L4+L5) of the contact pin 40 as shown in FIG. 3D, not including the length of the terminal portion 42. Thus, when the contact pin 40 is fully inserted into the through-hole 51 and fully contained therein, the coil spring 45 is compressed by the length of {(L2+L4+L5)-L7}. As a result, the tip of the terminal portion 42 of the first plunger 41 is forced upward to project from the through-hole 51. The second plunger 46 is also forced downward by the coil spring 45.

FIGS. 5A and 5B show the state wherein the IC package 1 is not installed on the IC socket 10, i.e., the state wherein the contact pin 40 is free.

When the IC socket 10 is installed on the pitch conversion substrate 70 through the setscrew 5 (see FIG. 1B), the contact pin 40 is completely contained in the through-hole 51 of the insulation base 50 as shown in detail in FIGS. 5A and 5B. More specifically, as described previously, the first plunger 41 is prevented from moving upward because of the engagement between the upper step 43a of the wider portion 43 and the step 51b of the through-hole 51, while the second plunger 46 is forced into the through-hole 51 by the pitch conversion substrate 70. Inconsequence, the coil spring 45 is kept compressed. Further, the bottom of the second plunger 46 is in contact with the land 71 of the printed circuit pattern formed on the pitch conversion substrate 70.

FIGS. 6A through 6C show the state wherein the IC package 1 is installed on the IC socket 10 or the state that permits the test of the IC package.

As the installed IC package is inserted gradually into the opening 21 by the cover member 31, the solder balls 2 of the IC package 1 come into contact with the terminals 42 of the first plunger 41, whereby the first plunger 41 is further forced down to a predetermined position as shown in FIGS. 6A and 6B. In consequence, the coil spring 45 is compressed further, whereby the reaction force thereof causes the terminal portions 42 and the solder balls 2, as well as the second plunger 46 and the land 71, to be brought into contact with each other respectively with a predetermined pressure. In this situation, as emphatically illustrated in FIG. 6C, the coil spring 45 is distorted to some extent within the through-hole 51. Such distortion of the coil spring 45 can cause the first plunger to incline slightly. And, such inclination of the first plunger 41 enables the bottom end of the shaft 44 of the first plunger 41 to come into contact with the inside wall of the second plunger 46. Thus, when it is designed so that the first plunger 41 and the second plunger 46 are permitted to contact directly with each other, a short current path, not including the coil spring 45, can be formed. As discussed previously, in the case of the present embodiment, since the second plunger 46 has a U-shape section (see FIGS. 3C, 3D), the second plunger 46 has an open portion (i.e., wall-less portion). Thus, it is desired to provide an engaging mechanism between the coil spring and the plunger so as to prevent the bottom end of the shaft 44 of the first plunger 41 from inclining towards the open portion.

Figure 10:
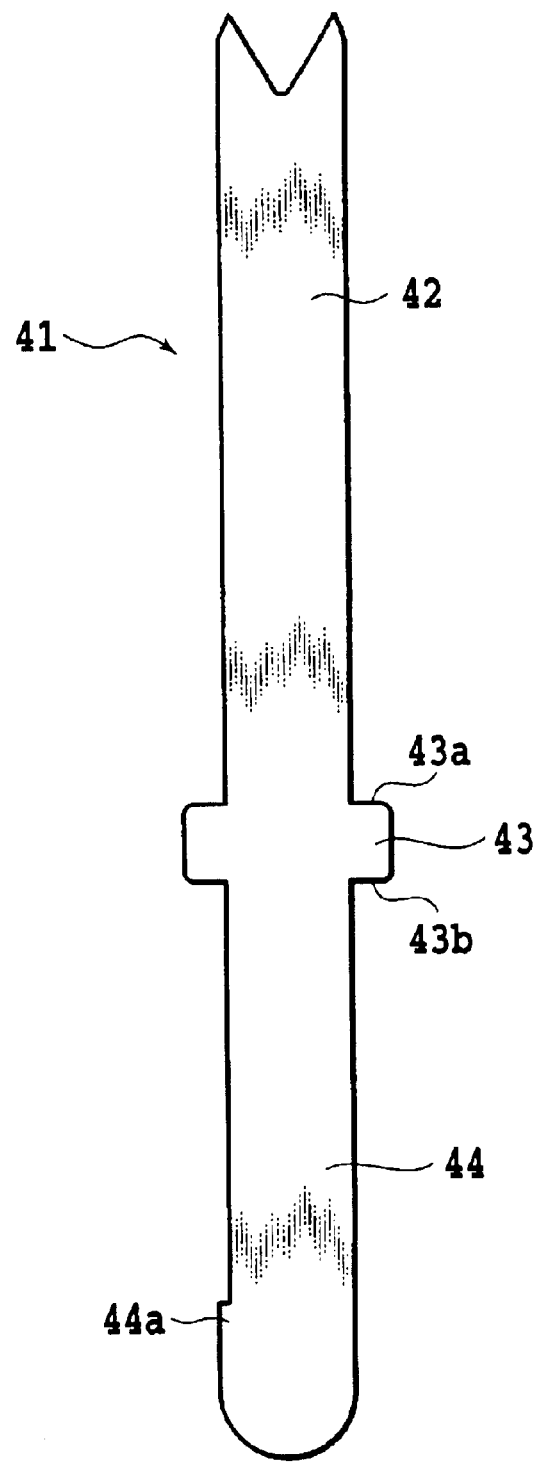
FIG. 10 shows another variation of the plunger to be in contact with the IC package.
Figure 11:
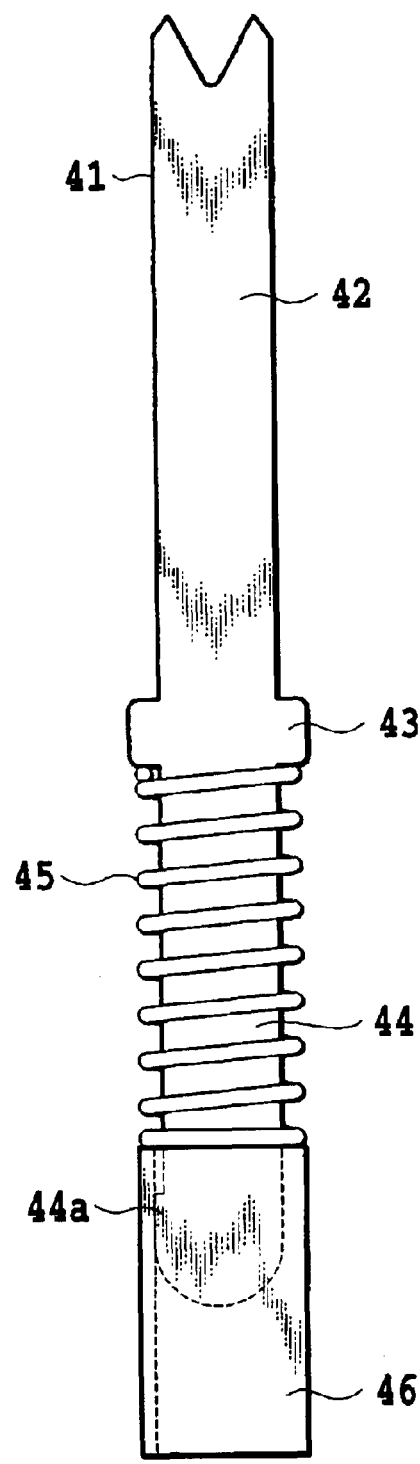
FIG. 11 shows a contact pin incorporating a plunger shown in FIG. 10 instead of the first plunger in the first embodiment.

Further, as shown in FIG. 10, in order to ensure the direct contact between the shaft 44 of the first plunger 41 and the second plunger 46, a projection 44a may be provided at the bottom end of the shaft 44 so that the shaft 44 and the inside wall of the second plunger 46, having a substantially U-shape section, can contact. When constructed in this way, as shown in FIG. 11, the projection 44a at the bottom end of the shaft 44 is always kept in contact with the inside wall of the second plunger 46, whereby not only the coil spring 45 but also the length of the first plunger 41 can be made shorter. In consequence, not only the current path can be made shorter for reducing the influence of the high-frequency waves but also the size of the IC socket can be made more compact.

The contact pin according to the present embodiment, not including the coil spring, is formed from a thin metal sheet by the press and thus is not only adaptable to the requirement of the fine pitch arrangement but also can be manufactured easily, thereby further contributing to the reduction of the manufacturing time and cost. Further, the current path can be shortened by not including the coil spring. Further, the overall length of the contact pin can be reduced, thereby also reducing the influence of the high-frequency waves.

The Second Embodiment

Figure 8A:
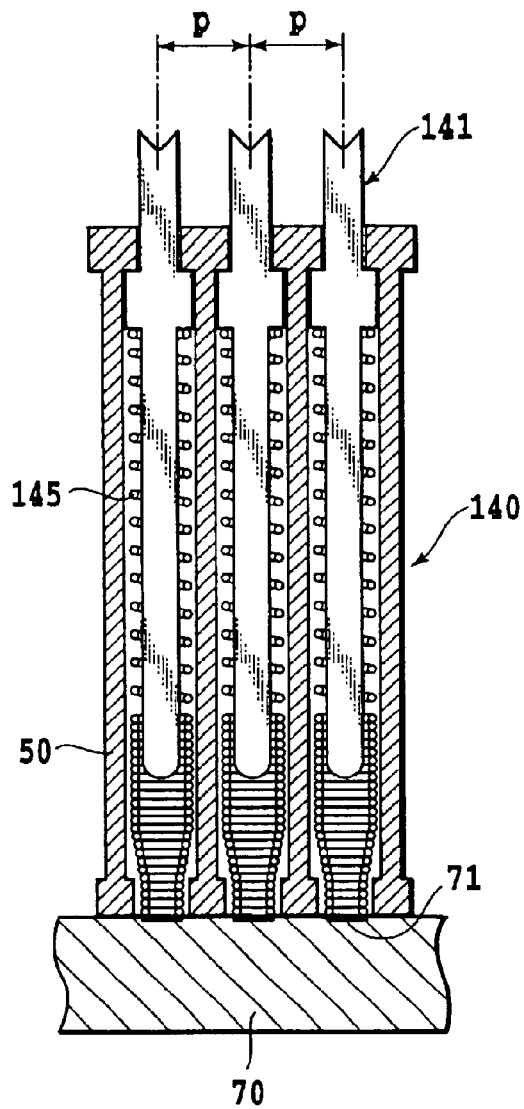
Figure 8B:
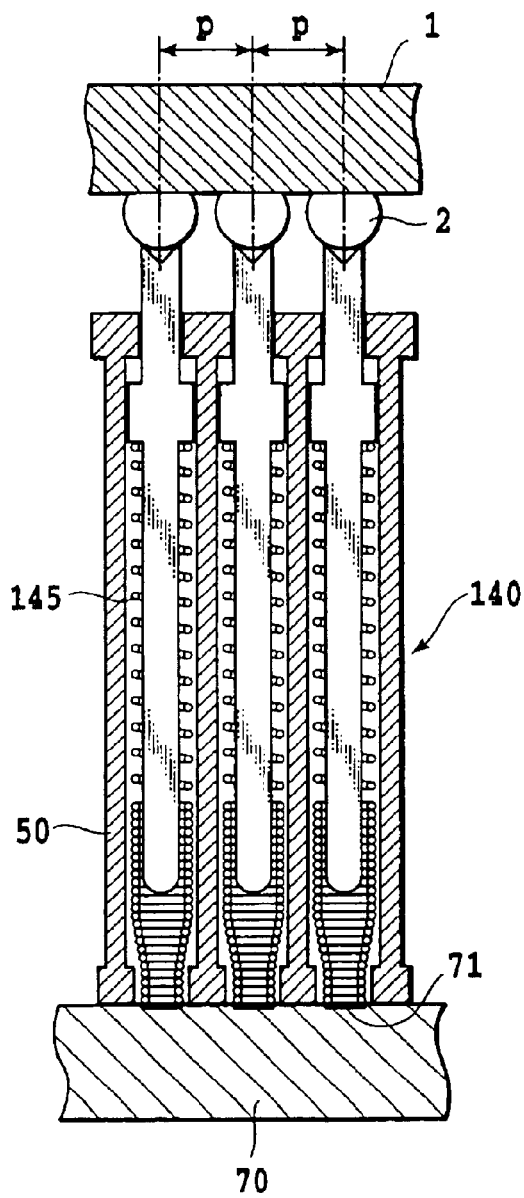

FIGS. 7A–7C and 8A–8B show the contact pin as the second embodiment of the present invention. FIGS. 7A–7C show an exploded view and an assembled view of the contact pin, of which FIG. 7A is a perspective view of the first plunger; FIG. 7B, a perspective view of the coil spring;

FIG. 7C, a perspective view of the contact pin formed by assembling the various elements shown in FIGS. 7A and 7B. FIGS. 8A and 8B are partial sectional views of the contact pin incorporated into the insulation member, wherein FIG. 8A shows the state in which the IC package is not installed, while FIG. 8B shows the state in which the IC package is installed on the IC socket.

As shown in FIGS. 7A and 7B, the contact pin 140 according to the present embodiment comprises a plunger 141 and a coil spring unit 145.

The plunger 141 is substantially similar in the form to the first plunger 41 of the first embodiment and serves as a first terminal to be electrically in contact with the solder ball 2 of the IC package 1. As shown in FIG. 7A, the plunger 141 comprises a terminal portion 142 to be electrically in contact with the solder ball 2 of the IC package 1, a wider portion 143, including an upper step 143a for preventing the plunger 141 from jumping out from the through-hole 51 of the insulation base 50 and a lower step 143b for engaging with the coil spring unit 145, and a shaft 144 to be set for moving upward and downward within the coil spring unit 145.

The coil spring unit 145 is designed so as to be replaceable with the coil spring 45 and the second plunger 46 according to the first embodiment. More specifically, the coil spring unit 145 comprises a coil spring portion 146, a tight-winding coil portion 147 and a fine tight-winding coil portion 148 having an outside diameter smaller than the tight-winding coil portion 147. The length of the coil spring 146 is made a little shorter than the shaft 144 of the plunger 141. The tight-winding coil portion 147 corresponds to the second plunger 46 of the first embodiment, while the fine tight-winding coil portion 148 serves as the second terminal to be in electrical contact with the land 71 of the pitch conversion substrate 70.

As shown in FIG. 7C, the contact pin 140 is assembled so that the upper end 146 of the coil spring portion 146 of the coil spring unit 145 engages with the lower step 143b of the wider portion 143 of the plunger 141. In this case, the bottom end of the shaft 144 of the plunger 141 is designed to lie inside the tight-winding portion 147 of the coil spring unit 145.

The contact pin 140, assembled as described above, is placed inside the through-hole 51 of the insulation base 50 similarly to the case of the first embodiment, and is fixed to the pitch conversion substrate 70 through a setscrew 5.

FIG. 8A shows the state wherein the contact pin 40 is free, while FIG. 8B shows the state for testing the IC package.

In the case of the present embodiment too, as shown in FIG. 8A, when the contact pin 140 is fully set inside the through-hole 51 of the insulation base 50, the coil spring portion 146 of the coil spring unit 145 is compressed, thereby causing not only the upper step 143a of the wider portion 143 of the plunger 141 to come into contact with the step 51b of the through-hole 51 but also causing the bottom end of the fine tight-wind portion 148 to be pushed to come into contact with the land 71 of the pitch conversion substrate 70.

Next, when the IC package 1 is installed, the terminal portion 142 of the plunger 141, while being in contact with the solder ball 2, is pushed downward to further compress the coil spring portion 146. In this situation, the terminal portion 142 and the solder ball 2, as well as the fine tight-winding portion 148 and the land 71, are forced to come into contact with each other respectively with a predetermined pressure owing to the reaction force of the coil spring portion 146 for providing sure electrical contacts.

Figure 12:
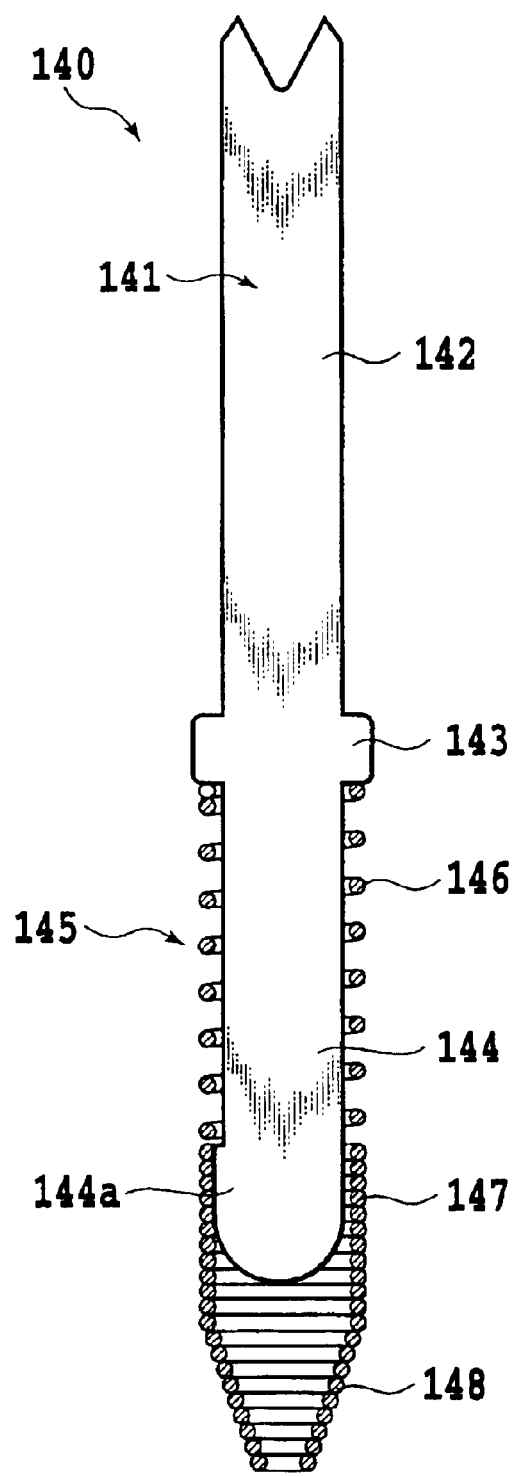
FIG. 12 shows a contact pin incorporating the plunger shown in FIG. 10 as a substitute for the plunger in the second embodiment.

In the case of the present embodiment too, in order to ensure the contact between the bottom end of the shaft 144 of the plunger 141 and the tight-winding portion 147 of the coil spring unit 145, a projection 144a may be formed at the bottom end of the shaft 144 as shown in FIG. 12.

In the case of the contact pin according to the present embodiment, the second plunger may be omitted, whereby not only the number of the parts can be reduced but also the processes of the manufacture and assembly of the IC socket can be made simpler compared with the case of the first embodiment.

The Third Embodiment

Figure 13:
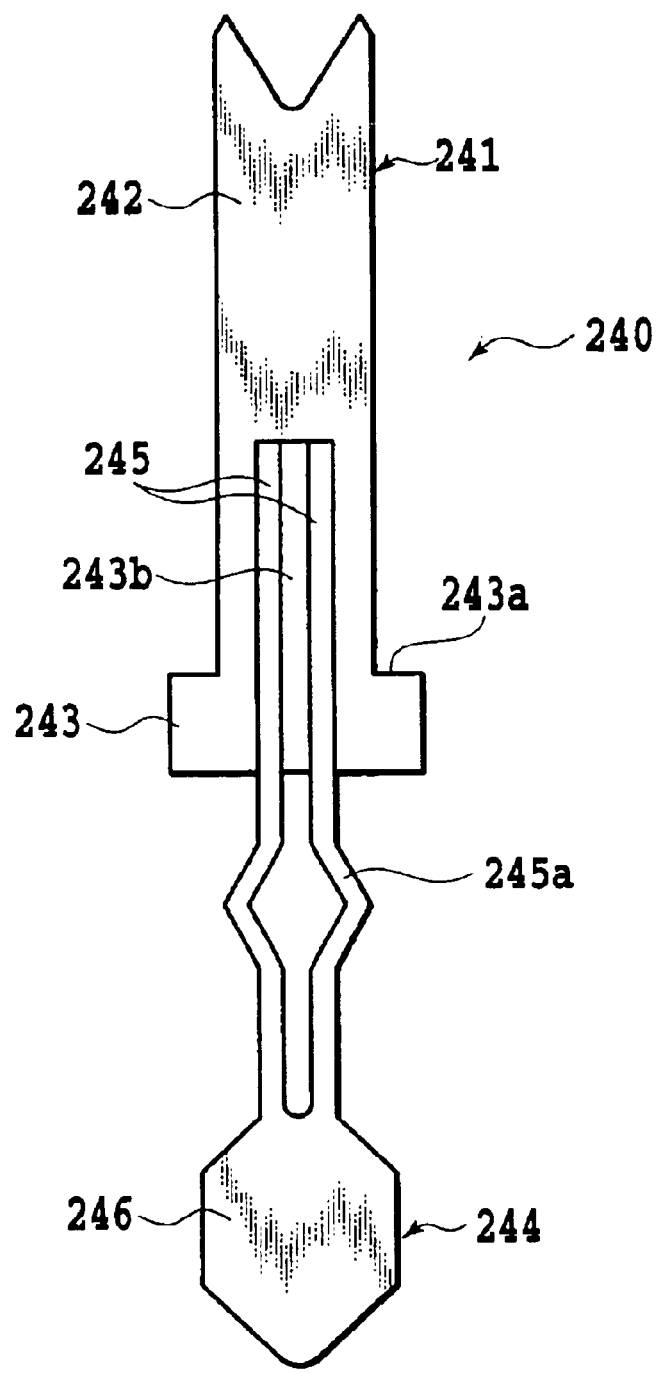
FIG. 13 is an assembled view of the contact pin according to the third embodiment.
Figure 14:
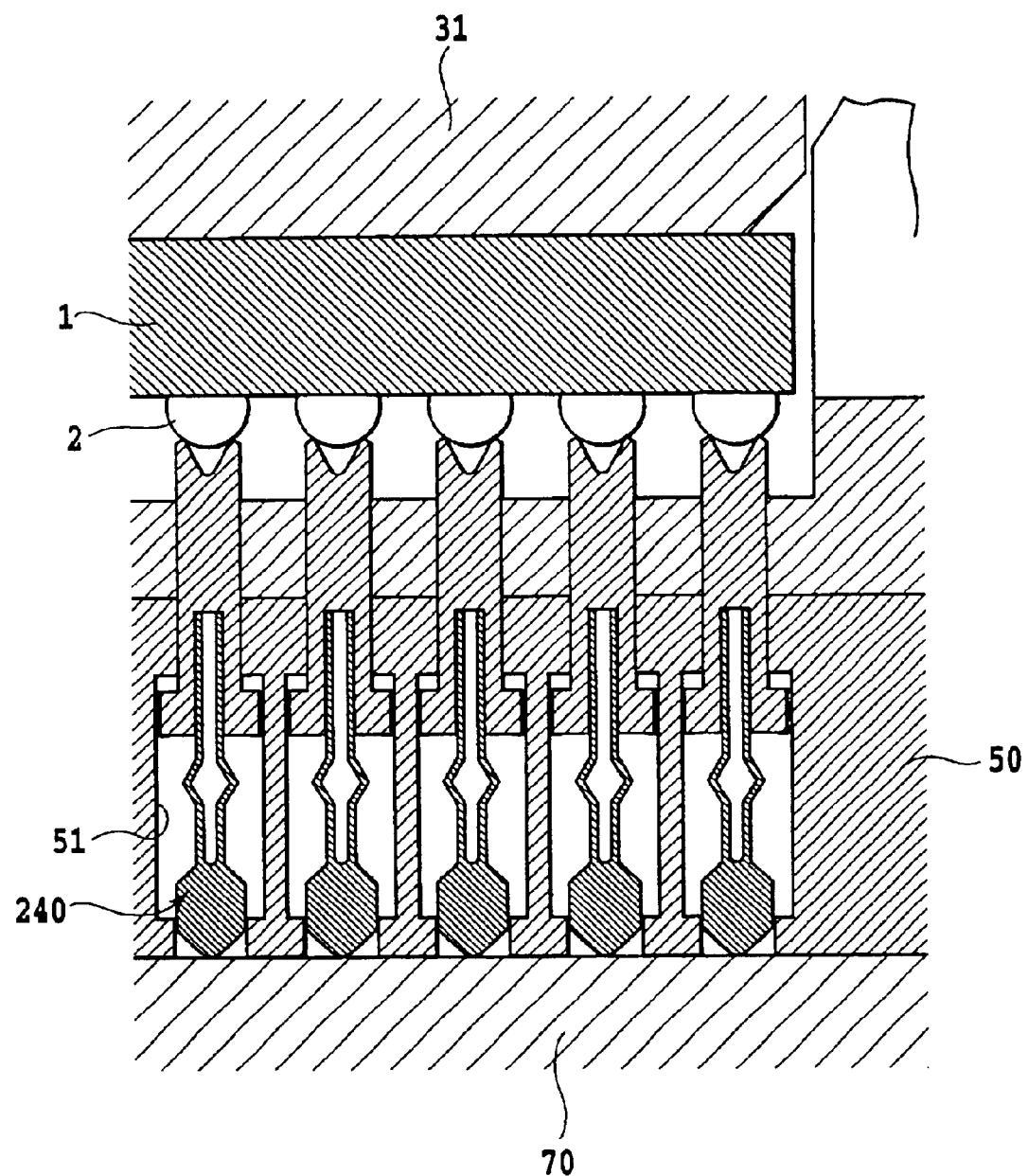
FIG. 14 is a partial enlarge view of the IC socket incorporating the contact pins according to the third embodiment provided for the test of the IC socket.

FIGS. 13 and 14 show the contact pin as the third embodiment of the present invention respectively. FIG. 13 is an assembled view of the contact pin, while FIG. 14 is a partial enlarged view of the IC socket in the state for testing.

The contact pin 240 according to the present embodiment is characterized, as shown in FIG. 13, by comprising a first plunger 241 and a second plunger 244, which are integrally assembled.

The first plunger 241 functions as a first terminal to be electrically in contact with the solder ball 2 of the IC package 1 and, as shown in FIG. 13, includes a first terminal portion 242 to be electrically in contact with the solder ball 2 of the IC package 1, a wider portion 243, provided with a step 243a for preventing the first plunger 241 from jumping out from a through-hole 51 of the insulation base 50. The wider portion 243 is provided with a fitting indent 243b opening downward.

The second plunger 244 functions as a second terminal to be electrically in contact the land 71 of the pitch conversion substrate 70, and, as shown in FIG. 13, includes a second terminal portion 246 to be electrically in contact with the land 71 of the pitch conversion substrate 70, and a pair of legs 245, extending upward from the second terminal portion 246 to fit in the fitting indent 243b. The pair of the legs 245 is desired to be formed by being cut from a thin metal sheet by the press so that the two legs thereof depart slightly from each other as extending upward. When formed in this fashion, the pair of legs 245 can be made elastic outwards when fitting in the fitting indent 243b, whereby the pair of legs 245 is fit securely inside the fitting indent 243b. Further, as shown in FIG. 13, there is provided a pair of dogleg shaped bent portions opposing to each other at the middle of the legs 245. Further, for the shape of the bent portions 245a, the circular arc shape may be substituted for the dogleg-shape. In other words, the shape of the bent portions need not be limited to these shapes, and so any shape permitting the elastic vertical extension and contraction of the pair of the legs 245 can be adopted.

As shown in FIG. 14, the contact pin 240 according to the present embodiment is contained in the through-hole 51 formed with the insulation base 50 of the IC socket 10 similarly to the cases of the first and the second embodiments. The installation of the IC package 1 on the IC socket 10 causes the first plunger 241 to be forced downward while in contact with the solder ball 2 of the IC package 1. As a result, the bent portions 245a formed with the pair of legs 245 of the second plunger 244 elastically deform. The reaction forces of the bent portions 245a cause the first plunger 241 and the solder ball 2 to be brought into electrical contact with each other with a predetermined pressure. Similarly, the second plunger 244 and the land 71 of the pitch conversion substrate 70 are brought into the same condition.

In the case of the present embodiment, the coil spring can be omitted, so that not only the number of parts can be reduced but also the manufacture and the assembly of the IC socket can be made easier compared with the case of the first embodiment.

The Fourth Embodiment

Figure 15:
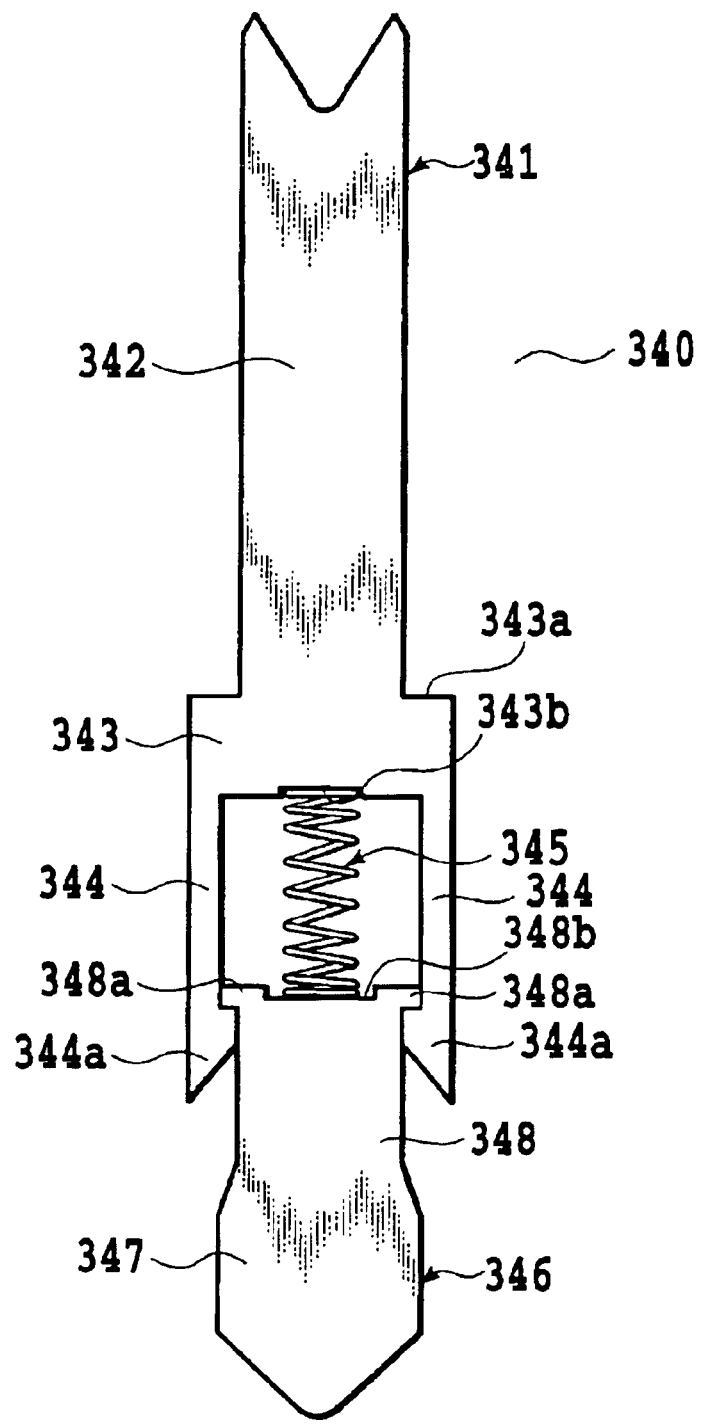
FIG. 15 is an assembled view of the contact pin according to the forth embodiment.
Figure 16:
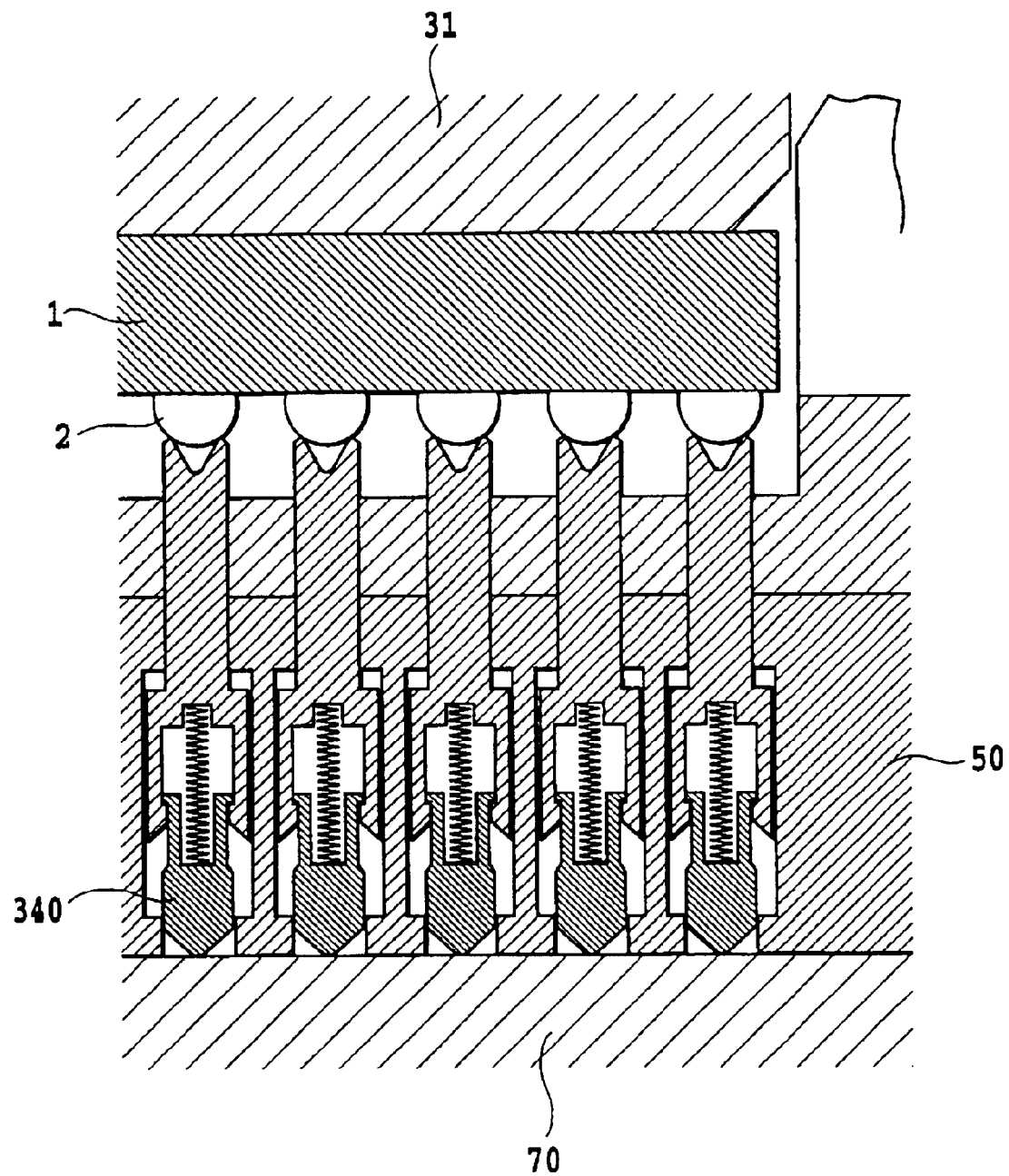
FIG. 16 is a partial enlarged view of the IC socket incorporating the contact pin according to the fourth embodiment provided for the test of the IC socket.
Figure 17:
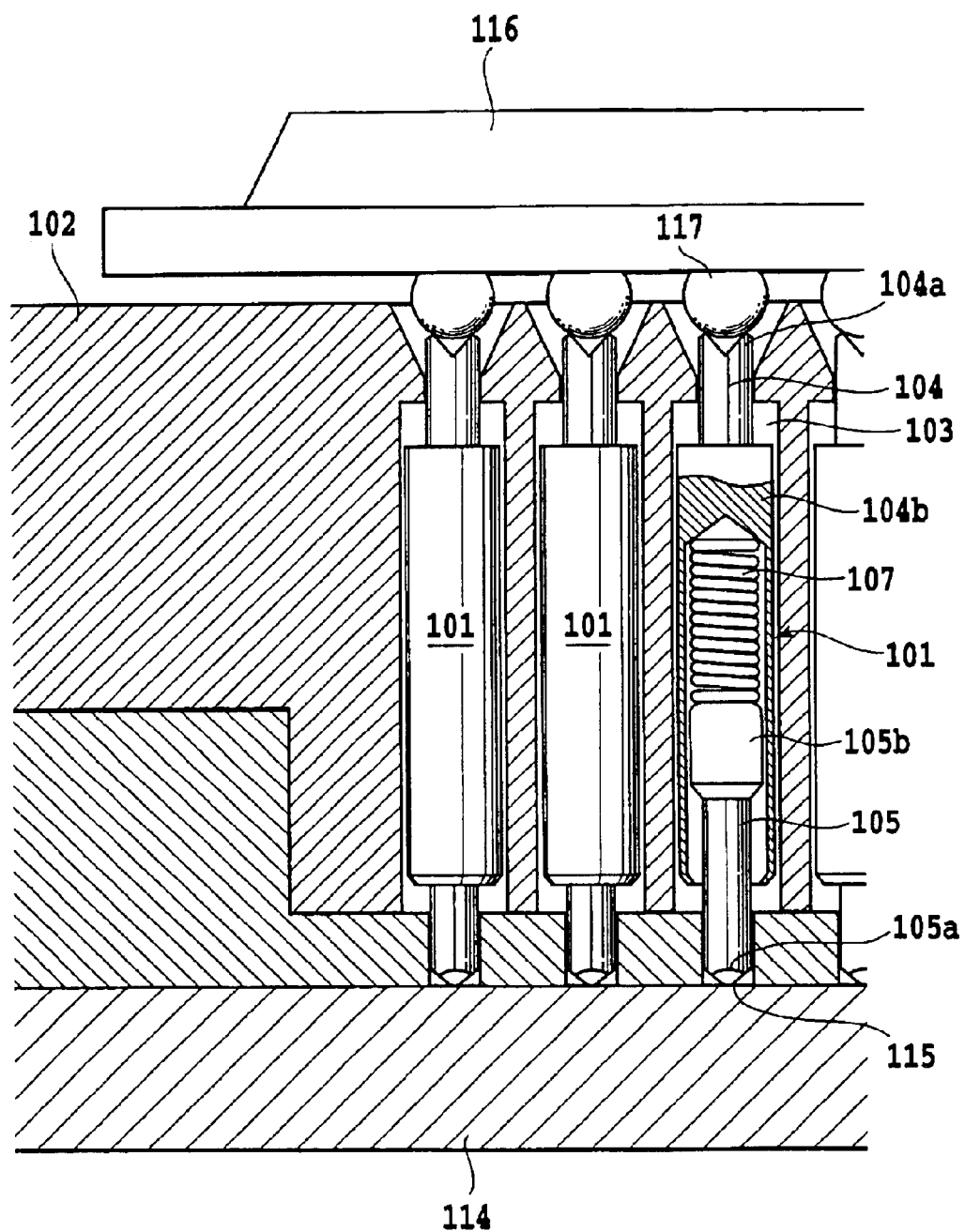
FIG. 17 is a partial sectional view of the IC socket incorporating conventional contact pins.

FIGS. 15 and 16 show the contact pin as the fourth embodiment of the present invention. FIG. 15 is an assembled view of the contact pin, while FIG. 16 is a partial enlarged section of the IC socket in the state for testing.

The contact pin 340 according to the present embodiment is characterized by comprising a first plunger 341 and a second plunger 345 which are directly in contact with each other and slidable with each other, as seen from FIG. 15.

The first plunger 341 functions as a first terminal to be in electrical contact with the solder ball 2 of the IC package 1, and, as shown in FIG. 15, comprises a first terminal portion 342 to be in electrical contact with the solder ball 2 of the IC package 1 and a wider portion 343 including a step 343a for preventing the first plunger 341 from jumping out of the through-hole 51 of the insulation base 50. The wider portion 343 has an indent 343b to serve as the seat of the spring provided at the middle of the bottom of the wider portion 343 as shown in FIG. 15. Further, the wider portion 343 is provided with a pair of legs 344 extending downward from the two sides thereof. The bottom ends of the pair of legs 344 are respectively provided with an inward engaging click 344a.

The second plunger 346 functions as a second terminal for providing the electrical contact with the land 71 of the pitch conversion substrate 70, and, as shown in FIG. 15, comprises a second terminal portion 347 to be in electrical contact with the land 71 of the pitch conversion substrate 70 and an extended portion 348 extending upward from the second terminal portion 347 and formed to be vertically slidable between the pair of legs 344. Provided on both sides of the upper end of the extended portion 348 are a pair of outward engaging projections 348a for engaging with the engaging clicks 344a formed at the bottom ends of the pair of the legs 344. Further the indent 348b for serving as the seat of the spring is located at the center of the upper end of the extended portion 348.

In the case of the present embodiment, the coil spring 345 is disposed between the pair of the legs 344 formed at the two sides of the wider portion 343 of the first plunger 341, being disposed between the first plunger 341 and the second plunger 346. More specifically, the upper end of the coil spring 345 are forced into and fixed to the indent 343b for the coil spring seat of the first plunger 341, while the lower end is forced into and fixed to the indent 348b for the coil spring seat of the second plunger 346 respectively. In this way, the vertical motion of the contact pin 340 is made possible.

The contact pin 340 according to the present embodiment is contained in the through-hole 51 formed in the insulation base 50 of the IC socket 10 similarly to the embodiments 1 though 3 as shown in FIG. 16. When the IC package 1 is installed on the IC socket 10, the first plunger 341 is forced downward while maintaining the contact with the solder ball 2 of the IC package 1. This causes the coil spring 345 to be elastically deformed. Owing to the reaction force of the coil spring 345, the first plunger 341 and the solder ball 2 come into electrical contact with each other maintaining predetermined contact pressure. Similarly, the second plunger 346 and the land 71 of the pitch conversion substrate 70 come into electrical contact with each other.

In the foregoing cases of the embodiments of the present invention, the IC sockets have been described as being designed for use with the IC package having the solder balls pitched to 0.4 mm as the external terminals, but the IC sockets according to the present invention are not limited for use with the solder balls pitched to 0.4 mm. In other words, the form and the dimensions of the IC socket of the present invention can be varied depending on the pitch of the external terminals of the IC package. Further, the present embodiment has been described with respect to the IC socket connected with the test board or the like through the pitch conversion substrate, but the IC socket may be connected directly with the test board.

As has been discussed in the foregoing, the IC socket for the fine pitch IC package according to the present invention has adopted the contact pin plunger formed from a thin metal sheet, whereby the IC socket according to the present invention is not only applicable to the fine pitch IC package but also capable of meeting requirements for easier manufacturing process, shorter manufacturing time and lower manufacturing cost. Further, for realizing sure electrical contact between the contact pin and the external terminal, a predetermined contact pressure is applied to the contact pin and the external terminal. Further, the current path can be made shorter by not including the coil spring, thereby providing a better electrical characteristic. In addition, the overall length of the contact pin can be reduced to reduce the influence of the high-frequency waves.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. An IC socket for a fine pitch IC package, comprising
a socket body having an opening for guiding the IC package to a predetermined position,
an insulation base having a plurality of through-holes corresponding to the external terminals of the IC package,
contact pins placed in the through-holes respectively, and
a cover member for applying a predetermined pressure to bring the external terminals of the IC package and the contact pins into contact with one another,
wherein each of the contact pins is formed with the first plunger including a terminal portion to be in contact with an external terminal of the IC package, a wider portion whose width is larger than the width of the terminal portion and a shaft whose width is equal to or smaller than the width of the terminal portion, a coil spring permitting the shaft to be inserted therein, and a second plunger, having a U-shape section, to be connected to the contact terminal of external circuit.

2. An IC socket for a fine pitch IC package as claimed in claim 1, wherein a bottom end of the shaft of the first plunger is provided with a projection that is always kept in contact with the second plunger.

3. An IC socket for a fine pitch IC package as claimed in claim 1, wherein the first plunger and the second plunger are formed from a thin metal sheet by a press work.

4. An IC socket for a fine pitch IC package, comprising
a socket body having an opening for guiding the IC package to a predetermined position,
an insulation base having a plurality of through-holes corresponding to the external terminals of the IC package,
contact pins to be placed in the through-holes, and
a cover member for applying a predetermined pressure to bring the external terminals of the IC package and the contact pins into contact with one another, wherein each of the contact pins is formed with a plunger, including a terminal portion to be in contact with the external terminal of the IC package, a wider portion whose width is larger than the width of the terminal portion and a shaft whose width is equal to or smaller than the terminal portion, and a coil spring unit including a coil spring permitting the shaft to be inserted therein and a tight-winding coil portion following the coil spring.

5. An IC socket for a fine pitch IC package as claimed in claim 4, wherein the bottom end of the shaft of the plunger is provided with a projection that is always in contact with the tight-winding coil portion of the coil spring unit.

6. An IC socket for a fine pitch IC package as claimed in claim 4, wherein the plunger is formed from a thin metal sheet by the press work.

7. An IC socket for a fine pitch IC package, comprising a socket body having an opening for guiding the IC package to a predetermined position, an insulation base having a plurality of through-holes corresponding to the external terminals of the IC package, contact pins to be placed in the through-holes, and a cover member for applying a predetermined pressure to bring the external terminals of the IC package and the contact pins into contact with one another, wherein each of the contact pins is formed with a first plunger including a first terminal portion to be in contact with the external terminal of the IC package and a wider portion whose width is larger than the width of the first terminal portion and in which a fitting indent opening downward is disposed, and a second plunger including a second terminal portion to be in contact with the contact terminal of external circuit and a pair of legs extending upward from the second terminal portion to fit in the fitting indent and having elastically deformable bent portions provided at the middles of the legs.

8. An IC socket for a fine pitch IC package as claimed in claim 7, wherein the first plunger and the second plunger are formed from a thin metal sheet by the press work.

9. An IC socket for a fine pitch IC package, comprising a socket body having an opening for guiding the IC package to a predetermined position, an insulation base having a plurality of through-holes corresponding to the external terminals of the IC package, contact pins to be placed in the through-holes, and a cover member for applying a predetermined pressure to bring the external terminals of the IC package and the contact pins into contact with one another, wherein each of the contact pins is formed with a first plunger including a first terminal portion to be in contact with the external terminal of the IC package, a wider portion whose width is larger than the width of the first terminal portion and provided with a pair of legs extending downwardly from two sides of the wider portion, a second plunger including a second terminal portion to be connected with the contact terminal of the external circuit and an extended portion extending upwardly from the second terminal portion and slidably interposed between the pair of legs of the wider portion and a coil spring interposed between the pair of legs.

10. An IC socket for a fine pitch IC package as claimed in claim 9, wherein the first plunger and the second plunger are formed from a thin metal sheet by the press work.

* * * * *